US011444120B2

(12) United States Patent
Xi et al.

(10) Patent No.: US 11,444,120 B2
(45) Date of Patent: Sep. 13, 2022

(54) DISPLAY APPARATUS AND METHOD OF FABRICATING THE SAME

(71) Applicant: Au Optronics Corporation, Hsinchu (TW)

(72) Inventors: Peng-Bo Xi, Hsinchu (TW); Chun-Cheng Cheng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 72 days.

(21) Appl. No.: 17/079,540

(22) Filed: Oct. 26, 2020

(65) Prior Publication Data

US 2021/0217806 A1 Jul. 15, 2021

Related U.S. Application Data

(60) Provisional application No. 62/960,846, filed on Jan. 14, 2020.

(30) Foreign Application Priority Data

May 13, 2020 (TW) ................................ 109115866

(51) Int. Cl.

*H01L 27/15* (2006.01)
*H01L 33/00* (2010.01)
*H01L 33/62* (2010.01)

(52) U.S. Cl.

CPC ........ *H01L 27/156* (2013.01); *H01L 33/0095* (2013.01); *H01L 33/62* (2013.01); *H01L 2933/0066* (2013.01)

(58) Field of Classification Search

CPC ... H01L 27/156; H01L 33/0095; H01L 33/62; H01L 2933/0066; H01L 25/0753;

(Continued)

(56) References Cited

U.S. PATENT DOCUMENTS 6,262,696 B1 * 7/2001 Seraphim .............. G02F 1/1333 345/1.3
8,223,087 B2 * 7/2012 Lee ..................... H01L 27/3293 345/1.3

(Continued)

FOREIGN PATENT DOCUMENTS

CN 109950226 6/2019
TW 201435831 9/2014

*Primary Examiner* — Victor A Mandala
(74) *Attorney, Agent, or Firm* — JCIPRNET

(57) ABSTRACT

A display apparatus including at least one display panel is provided. The display panel includes a substrate, pad structures, and openings. The substrate has a first and second surface opposite to each other. The pad structures are disposed on the first surface of the substrate. Each pad structure has a connection pad, a conductive pattern layer, and an auxiliary conductive layer electrically connected to each other. The auxiliary conductive layer is overlapped with the conductive pattern layer and the connection pad along a normal direction of the first surface. The openings are disposed on the substrate and penetrate the first and second surfaces of the substrate. The openings and the pad structures are alternately arranged. The substrate also has a third surface defining each opening and connected to the first and second surfaces. The third surface is not conductive. A method of fabricating the display apparatus is also provided.

11 Claims, 17 Drawing Sheets

X Z Y EC2 DP1(DP) OP DP2(DP) PXR LED PS 110 CB CE PS C C' DP3 (DP) DP4 (DP) PL EC1 80s PL 80 BP 10

(58) Field of Classification Search
CPC .... G02F 1/13458; G02F 1/13336; G09F 9/30; G09F 9/302; G09F 9/3026
See application file for complete search history.

(56) References Cited

U.S. PATENT DOCUMENTS 9,590,025 B2* 3/2017 Yu ........................ H01L 27/3276
2003/0234343 A1* 12/2003 Cok ........................ G02B 6/08 348/E5.135
2007/0063209 A1* 3/2007 Sugiura .................. H01L 33/60 257/E33.072
2007/0164302 A1* 7/2007 Tanda .................. H01L 33/486 362/267
2011/0007258 A1* 1/2011 Hsu ...................... G02F 1/1339 349/154
2011/0175533 A1* 7/2011 Holman .................... F21S 2/00 362/147
2011/0221995 A1* 9/2011 Park .................... G02F 1/13336 349/58
2015/0267907 A1* 9/2015 Thompson ................ F21K 9/64 362/249.06
2016/0014882 A1 1/2016 Jongman et al.
2016/0154262 A1* 6/2016 Cho .................. G02F 1/133308 349/73
2016/0284678 A1* 9/2016 Kobayakawa ........ H01L 25/167
2016/0299370 A1* 10/2016 Wu ..................... G02F 1/13439
2017/0010638 A1* 1/2017 Park ...................... G06F 1/1643
2017/0047393 A1 2/2017 Bower et al.
2017/0090230 A1* 3/2017 Yoon ................. G02F 1/133308
2017/0140679 A1* 5/2017 Tomoda ................ G09F 9/3026
2017/0148374 A1* 5/2017 Lee ..................... G02F 1/13452
2017/0346164 A1* 11/2017 Kim ....................... H01Q 1/243
2017/0371376 A1* 12/2017 Chung .............. G02F 1/133305
2018/0190747 A1 7/2018 Son et al.
2019/0155564 A1 5/2019 Schwarz et al.
2019/0333455 A1* 10/2019 El-Ghoroury ......... H01L 25/167
2019/0334104 A1* 10/2019 Okazaki ................. H05B 33/02
2020/0211929 A1* 7/2020 Son .......................... G09G 5/08
2020/0295107 A1* 9/2020 Liu ..................... H01L 27/3276
2020/0295120 A1* 9/2020 Bower .................... G06F 3/147
2020/0312825 A1* 10/2020 Su ..................... H01L 23/49838
2020/0312883 A1* 10/2020 Qu .................... H01L 23/49805
2020/0313055 A1* 10/2020 Su ....................... H01L 25/0753
2021/0325711 A1* 10/2021 Choi ................. G02F 1/133512
2021/0327857 A1* 10/2021 Li ......................... H01L 27/124

* cited by examiner

DISPLAY APPARATUS AND METHOD OF FABRICATING THE SAME

CROSS-REFERENCE TO RELATED APPLICATION

This application claims the priority benefits of U.S. provisional application Ser. No. 62/960,846, filed on Jan. 14, 2020, and Taiwan application serial no. 109115866, filed on May 13, 2020. The entirety of each of the above-mentioned patent applications is hereby incorporated by reference herein and made a part of this specification.

BACKGROUND OF THE INVENTION

Field of the Invention

The invention relates to a display apparatus, and more particularly to a display apparatus having a light-emitting element.

Description of Related Art

With the gradual diversification of the applications of the display apparatus, the use of large display boards for displaying public information or advertisements in major exhibition halls or department stores is becoming increasingly popular. In order to reduce the cost of installation and maintenance of large display boards, tiled displays formed by tiling a plurality of display panels have become one of the common erection methods for such large display boards. In particular, light-emitting diode (LED) panels are gradually gaining popularity in the tiled display market due to their thinner appearance and ultra-narrow bezel design. In order to present clearer static/dynamic content, LED panels with high resolution and high frame rate are indispensable. However, with the increase in the resolution and driving frequency of light-emitting diode panels, the stability of signal transmission, the increase in driving current, and the electrical properties of driving circuits have become important issues that related manufacturers must address in the development process.

SUMMARY OF THE INVENTION

The invention provides a display apparatus having good driving electrical properties as well as increased size, resolution, and driving frequency.

The invention provides a method of fabricating a display apparatus having better tiling yield and may increase the design margin of a product.

A display apparatus of the invention includes at least one display panel. The display panel includes a substrate, a plurality of pad structures, and a plurality of openings. The substrate has a first surface and a second surface opposite to each other. The plurality of pad structures are disposed on the first surface of the substrate. Each of the pad structures has a connection pad, a conductive pattern layer, and an auxiliary conductive layer electrically connected to each other. The auxiliary conductive layer is overlapped with the conductive pattern layer and the connection pad along a normal direction of the first surface. The plurality of openings are disposed on the substrate and penetrate the first surface and the second surface of the substrate. The openings and the pad structures are alternately arranged. The substrate also has a third surface defining each of the openings and connected to the first surface and the second surface. The third surface is not conductive.

In an embodiment of the invention, the auxiliary conductive layer and the connection pad of the display apparatus respectively have a first width and a second width in an arrangement direction of the plurality of pad structures, and the first width is greater than the second width.

In an embodiment of the invention, the conductive pattern layer of the display apparatus is not overlapped with the connection pad in the normal direction of the first surface.

In an embodiment of the invention, the substrate of the display apparatus further has a fourth surface connected to the first surface, the second surface, and the third surface, and the conductive pattern layer of each of the pad structures is extended from the first surface to the fourth surface.

In an embodiment of the invention, the conductive pattern layer of each of the pad structures of the display apparatus is further extended to the second surface.

In an embodiment of the invention, the display apparatus further includes a plurality of connecting electrode layers covering the plurality of conductive pattern layers and the plurality of auxiliary conductive layers of the plurality of pad structures. The at least one display panel includes a first display panel and a second display panel, and each of the connecting electrode layers is electrically connected to one of the plurality of pad structures of the first display panel and one of the plurality of pad structures of the second display panel.

In an embodiment of the invention, the display apparatus further includes a carrier. The carrier has a carrier surface and a plurality of conductive bumps disposed on the carrier surface. The at least one display panel is disposed on the carrier surface, and the plurality of conductive pattern layers of the plurality of pad structures are respectively overlapped with the conductive bumps.

In an embodiment of the invention, the display apparatus further includes a plurality of connecting electrode layers covering the plurality of pad structures and the plurality of conductive bumps. The at least one display panel includes a first display panel and a second display panel, and each of the connecting electrode layers is electrically connected to one of the plurality of pad structures of the first display panel, one of the plurality of pad structures of the second display panel, and one of the conductive bumps.

In an embodiment of the invention, the plurality of connecting electrode layers of the display apparatus further directly cover a portion of a surface at which the plurality of conductive bumps and the plurality of pad structures are overlapped.

In an embodiment of the invention, a material of the substrate of the display apparatus includes an organic polymer material.

In an embodiment of the invention, the plurality of pad structures and the plurality of openings of the display apparatus are located at at least one substrate edge of the substrate.

A method of fabricating a display apparatus of the invention includes providing a display panel, cutting the display panel along a cutting path so that a substrate has a substrate edge corresponding to the cutting path, forming two protective layers at two opposite sides of the display panel, performing a conductive treatment on the substrate to form a conductive film layer, performing a drilling step to form a plurality of openings, and forming a plurality of auxiliary conductive layers on a plurality of conductive pattern layers and a plurality of connection pads. The display panel includes the substrate and the plurality of connection pads.

The substrate has a first surface and a second surface opposite to each other, and the connection pads are disposed on the first surface and arranged on the cutting path. The substrate has a bonding region adjacent to the substrate edge, and the protective layers only expose the bonding region. The conductive film layer is located in the bonding region and is not overlapped with the plurality of connection pads. A plurality of openings are disposed in the bonding region and are respectively located between the connection pads. The conductive film layer is disconnected by the openings and forms a plurality of conductive pattern layers structurally separated from each other. The substrate has a third surface defining each of the openings and connected to the first surface and the second surface, and the third surface is not conductive. A connection pad, a conductive pattern layer, and an auxiliary conductive layer located between any two adjacent openings and electrically connected to each other form a pad structure of the display panel.

In an embodiment of the invention, the method of fabricating the display apparatus further includes bonding at least one display panel onto a carrier surface of a carrier. The carrier has a plurality of conductive bumps disposed on the carrier surface. The plurality of conductive pattern layers of the plurality of pad structures of the at least one display panel are respectively overlapped with the conductive bumps.

In an embodiment of the invention, the method of fabricating the display apparatus further includes removing one of the two protective layers located at a side of the display panel facing the carrier before the bonding step of the display panel and the carrier.

In an embodiment of the invention, the method of fabricating the display apparatus further includes forming a plurality of connecting electrode layers on the plurality of pad structures and the plurality of conductive bumps, so that the pad structures are electrically connected to the conductive bumps.

In an embodiment of the invention, the step of forming the plurality of connection electrode layers in the method of fabricating the display apparatus includes applying a DC potential to the plurality of connection pads.

In an embodiment of the invention, the method of fabricating the display apparatus further includes, after the step of forming the plurality of connecting electrode layers, removing one of the two protective layers located at a side of the display panel away from the carrier.

In an embodiment of the invention, the method of fabricating the display apparatus further includes bonding a plurality of light-emitting elements onto the display panel after the removing step of the protective layer.

In an embodiment of the invention, the method of fabricating the display apparatus further includes bonding a plurality of light-emitting elements onto the display panel before the cutting step of the display panel.

In an embodiment of the invention, the auxiliary conductive layer and the connection pad of the method of fabricating the display apparatus respectively have a first width and a second width in an arrangement direction of the plurality of openings, and the first width is greater than the second width.

Based on the above, in the display apparatus and the method of fabricating the same of an embodiment of the invention, the plurality of openings disposed between the plurality of pad structures of the display panel may make the plurality of conductive pattern layers of the pad structures be structurally separated from each other to ensure the electrical independence of the pad structures. Via the overlapping relationship between the auxiliary conductive layers, the conductive pattern layers, and the connection pads, the electrical connection relationship between the conductive pattern layers and the connection pads may be stabilized, thereby increasing the bonding area of the pad structures to increase the bonding (or tiling) yield of the display panel and the driving electrical properties of the display apparatus.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
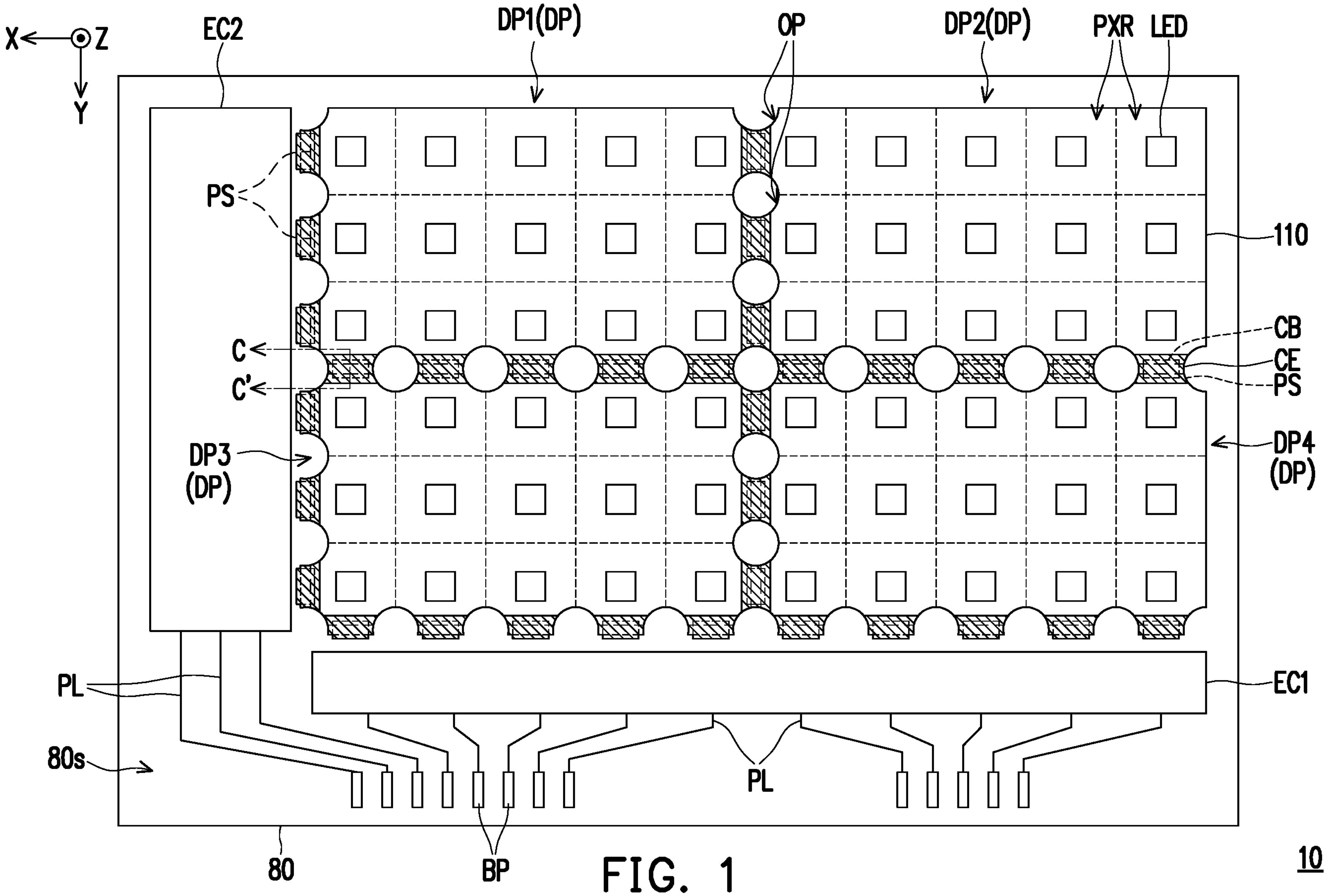
FIG. 1 is a top view of a display apparatus of an embodiment of the invention.

"About", "similar", "essentially", or "substantially" used in the present specification include the value and the average value within an acceptable deviation range of a specific value confirmed by those having ordinary skill in the art, and the concerned measurement and a specific quantity (i.e., limitations of the measuring system) of measurement-related errors are taken into consideration. For instance, "about" may represent within one or a plurality of standard deviations of the value, or, for instance, within ±30%, ±20%, ±15%, ±10%, or ±5%. Moreover, "about", "similar", "essentially", or "substantially" used in the present specification may include a more acceptable deviation range or standard deviation according to measurement properties, cutting properties, or other properties, and one standard deviation does not need to apply to all of the properties.

In the figures, for clarity, the thicknesses of, for instance, layers, films, panels, and regions are enlarged. It should be understood that, when a layer, film, region, or an element of a substrate is "on" another element or "connected to" another element, the element may be directly on the other element or connected to the other element, or an intermediate element may also be present. On the other hand, when an element is "directly on another element" or "directly connected to" another element, an intermediate element is not present. As used in the present specification, "connected to" may refer to a physical and/or electrical connection. Furthermore, "electrically connected" may mean that other elements are present between two elements.

In addition, relative terms such as "lower" or "bottom" and "upper" or "top" may be used herein to describe the relationship of one component to another component as shown in the figure. It should be understood that relative terms are intended to encompass different orientations of the device in addition to the orientation shown. For example, if the device in one figure is turned over, an element described as being on the "lower" side of the other elements is oriented to being on the "upper" side of the other elements. Thus, the exemplary term "below" may include the orientations "below" and "above", depending on the particular orientation of the figure. Similarly, if the device in one figure is turned over, an element described as "below" other elements or an element "below" is oriented "above" the other elements. Thus, the exemplary term "above" or "below" may encompass the orientations of above and below.

Hereinafter, exemplary embodiments of the invention are described in detail, and examples of the exemplary embodiments are conveyed via the figures. Wherever possible, the same reference numerals are used in the figures and the descriptions to refer to the same or similar portions.

Figure 2B:
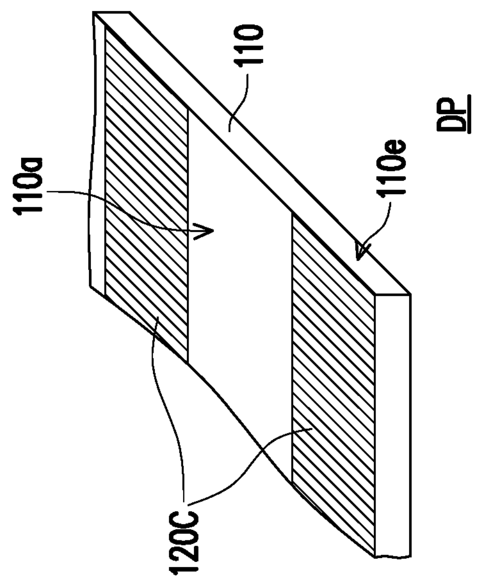
FIG. 2A to FIG. 2I are diagrams of a manufacturing process of the display apparatus of FIG. 1.
Figure 3B:
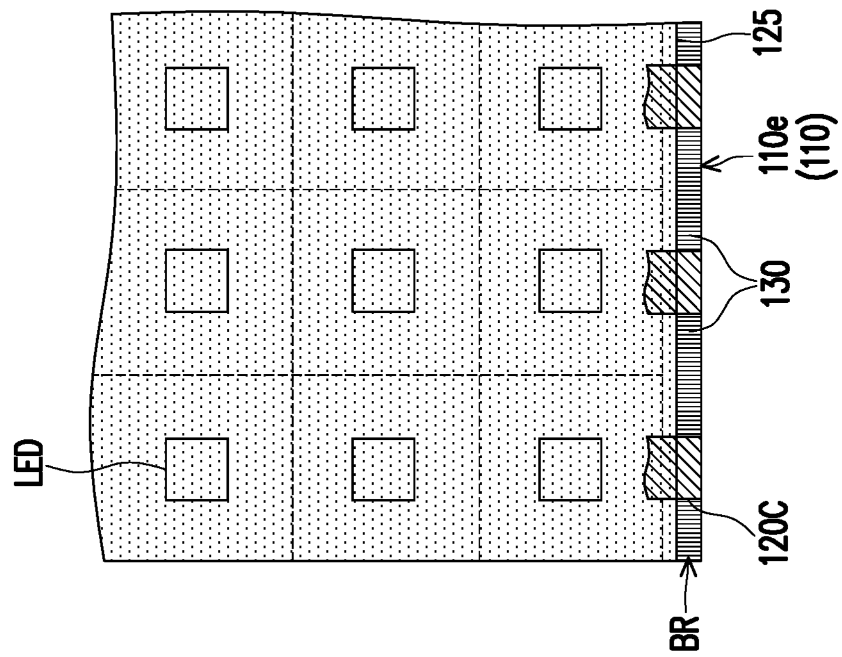
FIG. 3A to FIG. 3F are top views of a manufacturing process of the display apparatus of FIG. 1.
Figure 4B:
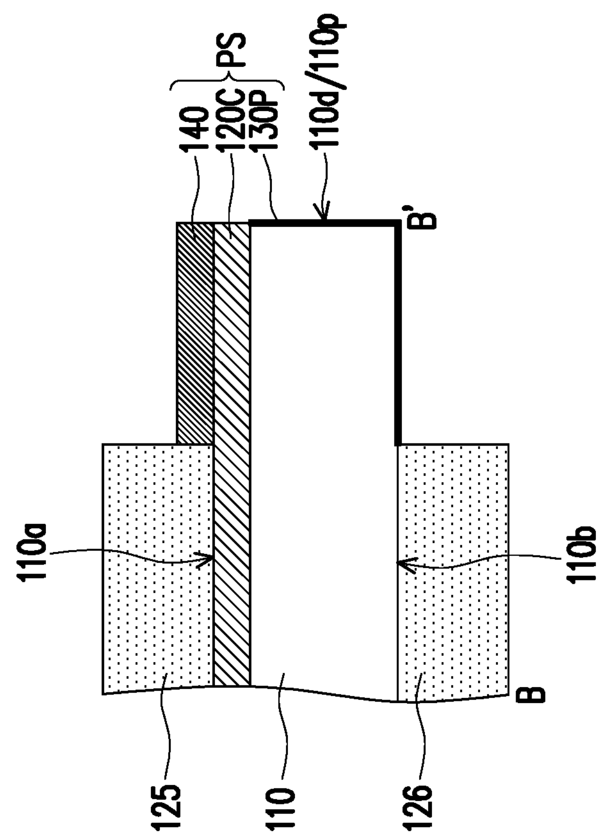
FIG. 4A and FIG. 4B are cross-sectional views of two different portions of the pad structure of FIG. 2F.
Figure 4A:
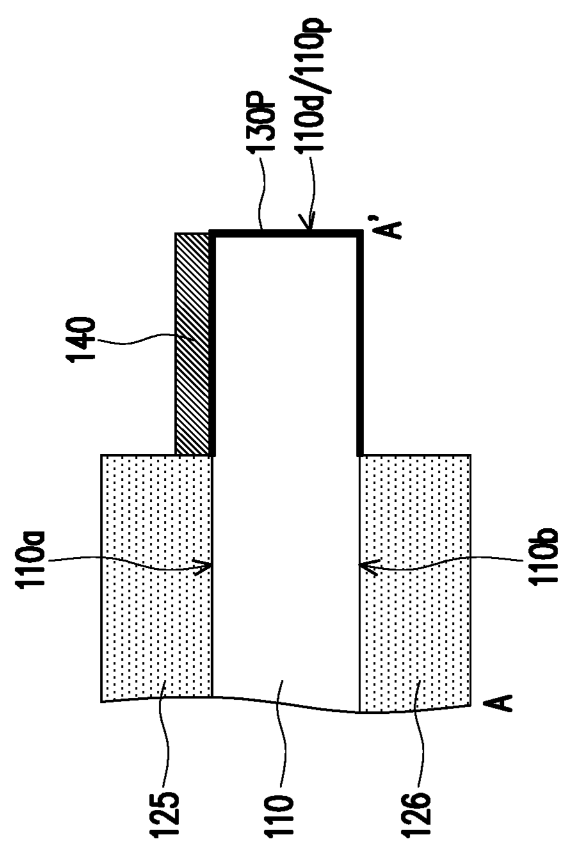
Figure 5A:
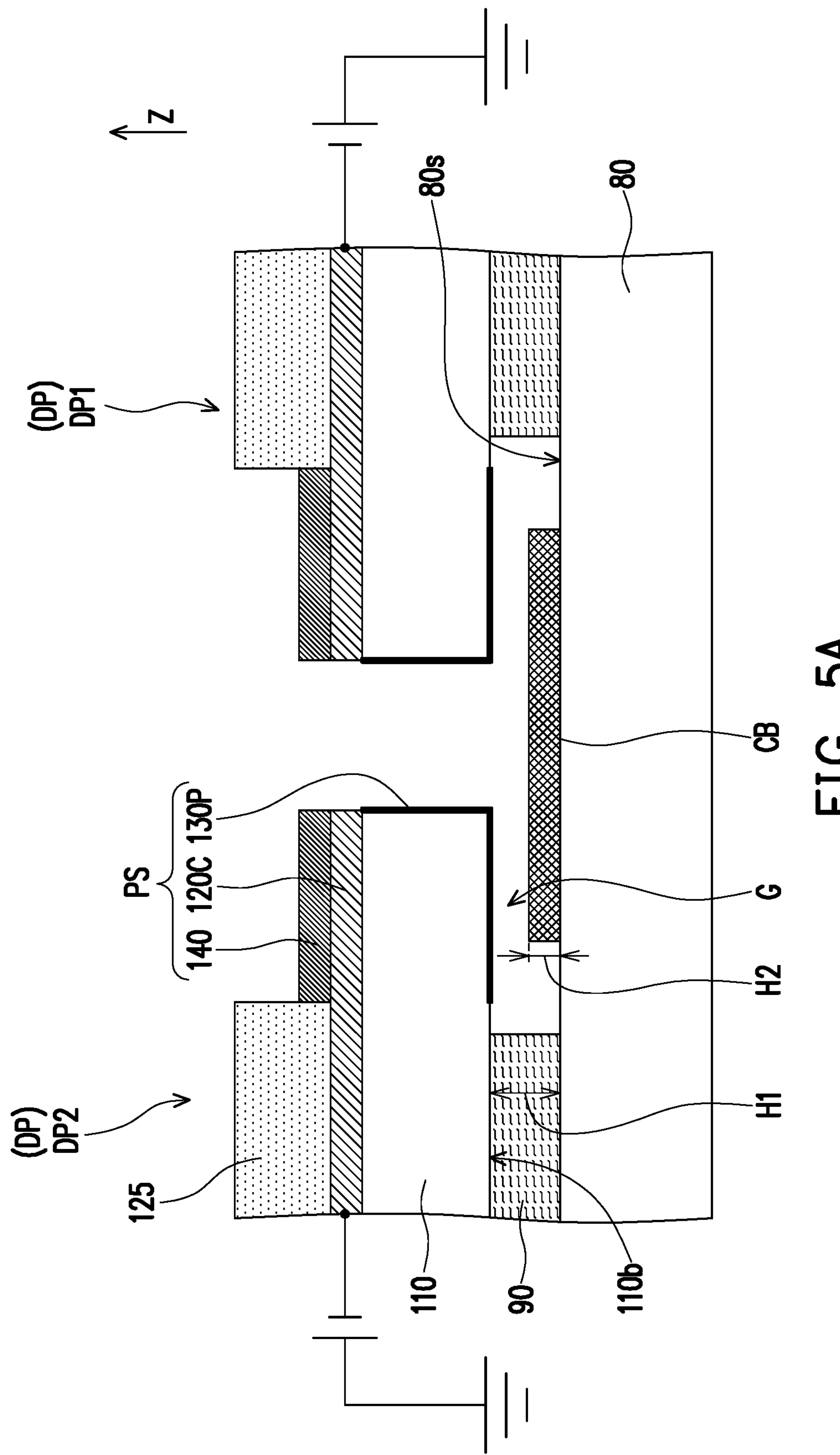
FIG. 5A and FIG. 5B are cross-sectional views of a manufacturing process of the display apparatus of FIG. 1.
Figure 5B:
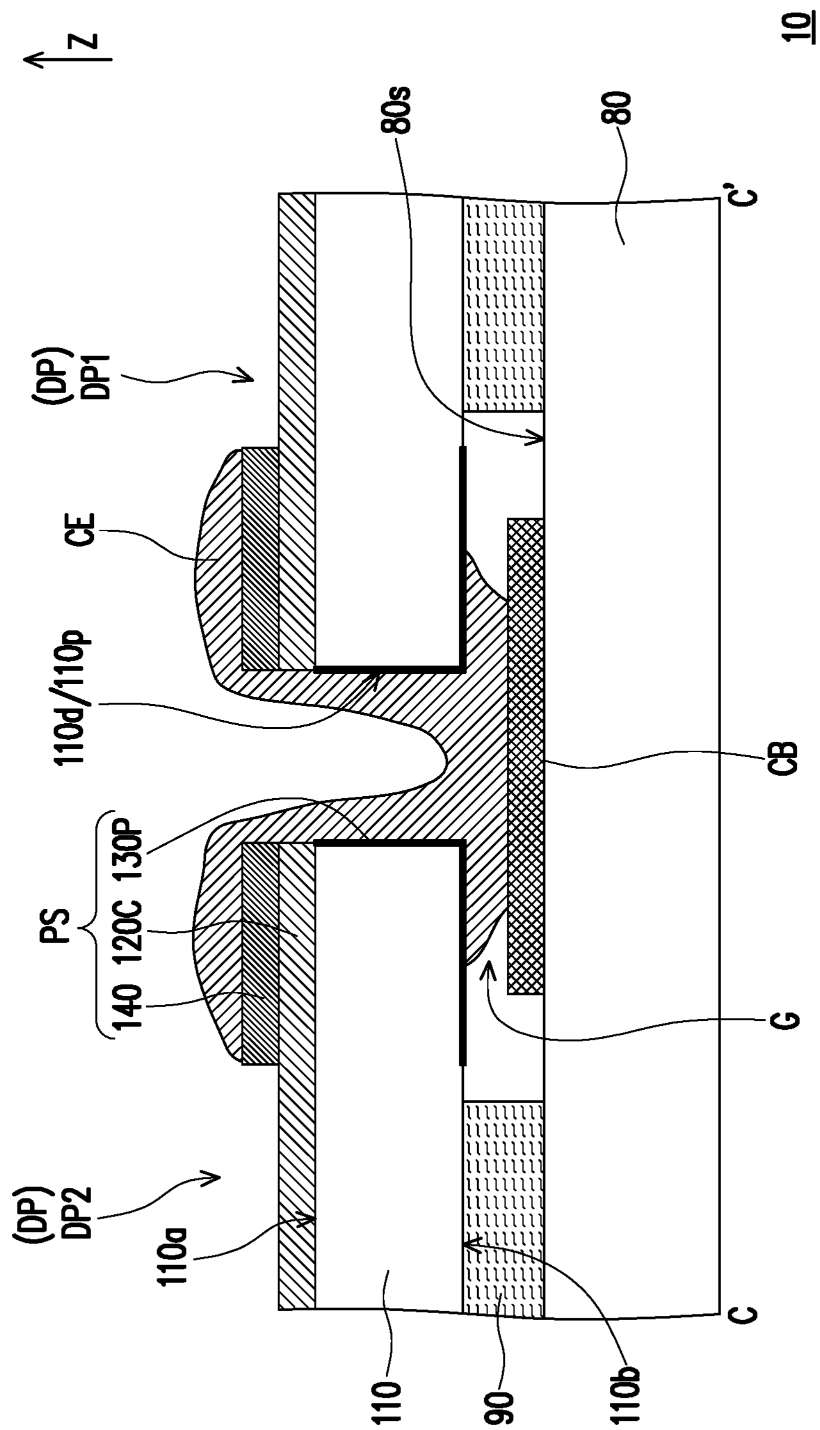

FIG. 1 is a top view of a display apparatus of an embodiment of the invention. FIG. 2A to FIG. 2I are diagrams of a manufacturing process of the display apparatus of FIG. 1. FIG. 3A to FIG. 3F are top views of a manufacturing process of the display apparatus of FIG. 1. FIG. 4A and FIG. 4B are cross-sectional views of two different portions of the pad structure of FIG. 2F. FIG. 5A and FIG. 5B are cross-sectional views of a manufacturing process of the display apparatus of FIG. 1. Specifically, FIG. 4A and FIG. 4B correspond to section line A-A' and section line B-B' of FIG. 2F, respectively, and FIG. 5B corresponds to section line C-C' of FIG. 1.

Referring to FIG. 1 and FIG. 5B, a display apparatus 10 includes a carrier 80 and at least one display panel DP disposed on a carrier surface 80*s* of the carrier 80. In the present embodiment, the number of the display panel DP of the display apparatus 10 is four, which are respectively a first display panel DP1, a second display panel DP2, a third display panel DP3, and a fourth display panel DP4. For example, the display panels DP may be arranged in a plurality of columns and a plurality of rows in a direction X and a direction Y, respectively, and connected to each other to form a tiled display apparatus 10. However, the invention is not limited thereto. In other embodiments, the tiling method of the plurality of display panels DP may also be adjusted to a honeycomb arrangement according to actual design requirements. It should be understood that, corresponding to different tiling methods, the vertical projection contours of the display panels DP on the carrier 80 may also be adjusted accordingly. It should be noted that in the invention, the number of the display panels DP of the display apparatus is not limited, and the number of the tiled display panels DP may be adjusted according to actual application requirements.

In the present embodiment, the display panels DP include a substrate 110 and a plurality of light-emitting elements LED. The substrate 110 has a plurality of pixel regions PXR, and the light-emitting elements LED are respectively disposed in the pixel regions PXR. For example, the light-emitting elements LED may be micro light-emitting diodes (micro-LEDs). That is, the display panels of the present embodiment may be micro-LED panels, but are not limited thereto. In an embodiment, the light-emitting elements LED may also be organic LEDs (OLEDs) or mini-light-emitting diodes (mini-LEDs). In another embodiment, the display panels may also be liquid crystal display panels.

In order to electrically connect the display panels DP, a plurality of conductive bumps CB are provided on the carrier surface 80*s* of the carrier 80, and the display panels DP further include a plurality of pad structures PS and a plurality of openings OP disposed on the substrate 110 and arranged alternately. The positions of the conductive bumps CB on the carrier 80 respectively correspond to the configuration positions of the plurality of pad structures PS of the display panels DP. It is worth mentioning that the arrangement of the openings OP may make the pad structures PS electrically independent from each other.

In the present embodiment, the pad structures PS and the openings OP are disposed at at least one substrate edge of the substrate 110 of the display panels DP. For example, the plurality of pad structures PS and the plurality of openings OP of the first display panel DP1 are respectively disposed at three substrate edges of the substrate 110 thereof, the plurality of pad structures PS and the plurality of openings OP of the second display panel DP2 are respectively disposed at two substrate edges of the substrate 110 thereof, the plurality of pad structures PS and the plurality of openings OP of the third display panel DP3 are respectively disposed at four substrate edges of the substrate 110 thereof, and the plurality of pad structures PS and the plurality of openings OP of the fourth display panel DP4 are respectively disposed at three substrate edges of the substrate 110 thereof, but the invention is not limited thereto. In other embodiments, the plurality of pad structures PS and the plurality of openings OP of the display panels may also be disposed in a portion of the pixel regions PXR of the substrate 110.

In particular, in addition to being electrically connected to the conductive bumps CB of the carrier 80 via the pad structures PS, the display panels DP may also be electrically connected to at least one display panel DP via the pad structures PS. For example, the first display panel DP1 is electrically connected to the second display panel DP2 and the third display panel DP3 via the plurality of pad structures PS disposed at two substrate edges. It should be understood that, in some embodiments, the display panels DP may also be directly electrically connected to the plurality of pad structures PS of another display panel DP via the plurality of pad structures PS, and the display apparatus formed by tiling the display panels DP does not need to have the carrier 80.

Furthermore, the carrier 80 of the display apparatus 10 may also have a plurality of non-pixel driving circuits (for example, a non-pixel driving circuit EC1 and a non-pixel driving circuit EC2), a plurality of bonding pads BP, and a plurality of peripheral traces PL. The peripheral traces PL are electrically connected to the non-pixel driving circuit EC1, the non-pixel driving circuit EC2, and the bonding pads BP. For example, the non-pixel driving circuits are multiplexers (MUXs), integrated gate driver-on-arrays (GOAs), electrostatic protection (ESD) circuits, test (TEST) circuits, or a combination thereof. The tiling process of the display apparatus 10 is exemplarily described below.

Figure 2A:
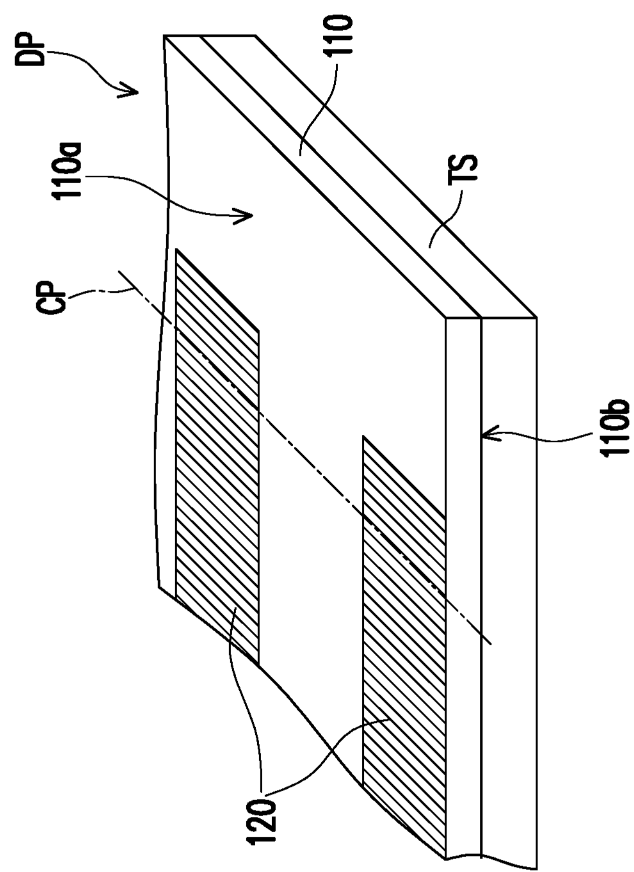
Figure 2D:
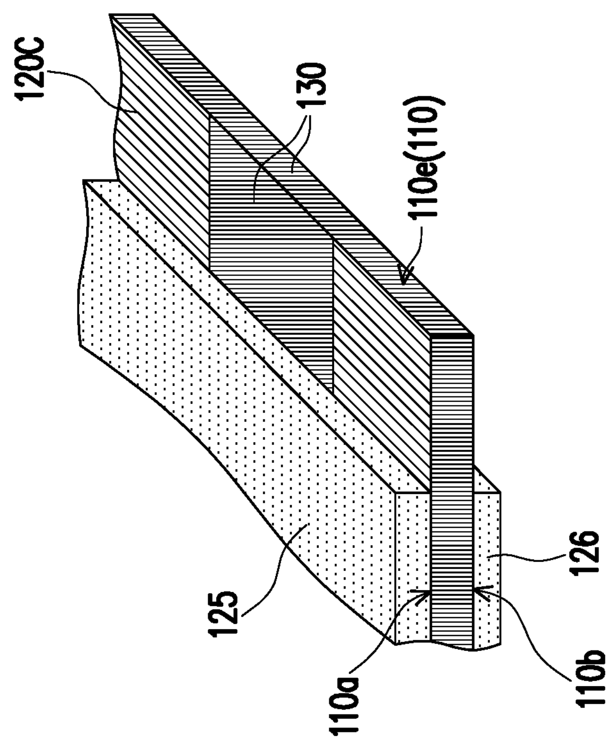
Figure 3A:
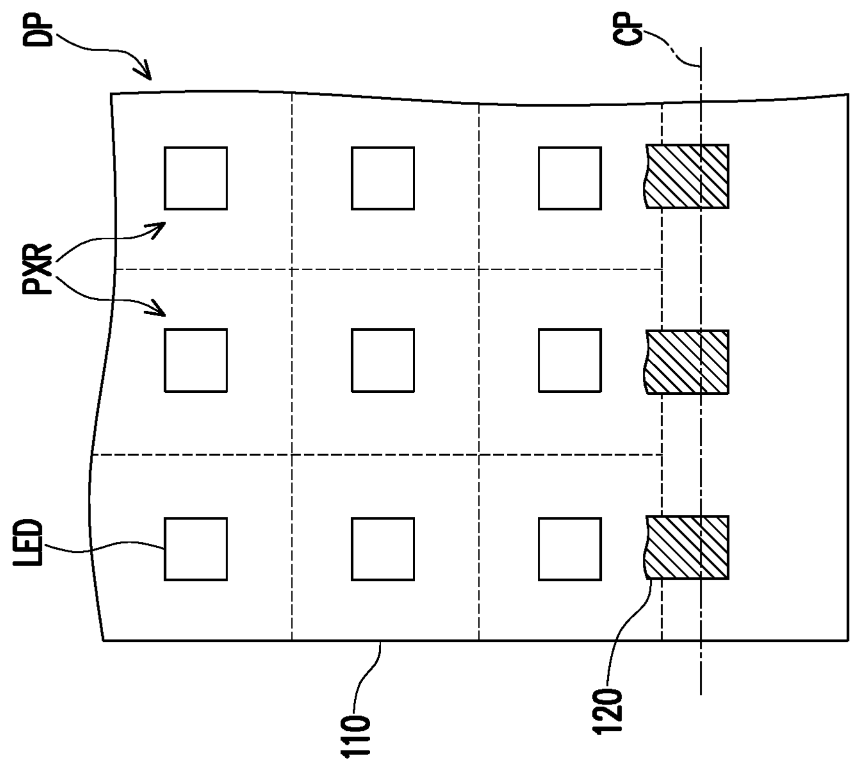

Please refer to FIG. 2A and FIG. 3A. First, a display panel DP is provided. The display panel DP includes a plurality of connection pads 120. The connection pads 120 are disposed on a first surface 110*a* of a substrate 110. For example, the connection pads 120 may be electrically connected to a pixel driving circuit (not shown) located in pixel regions PXR via conductive traces (such as data lines, scan lines, or power lines), and the pixel driving circuit is electrically connected to at least one corresponding light-emitting element LED. The pixel driving circuit may include at least one active element and/or at least one capacitor, but is not limited thereto.

In the present embodiment, a plurality of light-emitting elements LED are arranged in a plurality of pixel strings along a direction (a vertical direction as shown in FIG. 3A), the pixel strings are respectively electrically connected to a plurality of connection pads 120, and the connection pads 120 have a one-to-one corresponding relationship with the pixel strings, but the invention is not limited thereto. In other embodiments, the plurality of connection pads 120 and the plurality of pixel strings may also have a one-to-two or one-to-many corresponding relationship. More specifically, a driving signal (such as a current signal or a voltage signal) from an external signal source may be transmitted to the pixel driving circuit located in the pixel regions PXR via the connection pads 120 of the display panel DP to enable at least one corresponding light-emitting element LED.

Please refer to FIG. 2B and FIG. 3B at the same time. Then, the display panel DP is cut along a cutting path CP, so that the substrate 110 has a substrate edge 110*e* corresponding to the cutting path CP. It is worth noting that the cutting path CP is extended along the arrangement direction of the plurality of connection pads 120 and passes through the connection pads 120. That is, after the cutting step of the display panel DP is completed, one end of connection pads 120C is aligned with the substrate edge 110*e* of the substrate 110.

Before the cutting step of the display panel DP, a temporary substrate TS located on a second surface 110*b* of the substrate 110 may be removed first, but is not limited thereto. According to other embodiments, the removing step of the temporary substrate TS may also be performed after the cutting step of the display panel DP is completed. In the present embodiment, the substrate 110 of the display panel DP is a flexible substrate, and the material of the flexible substrate includes polyimide or other suitable organic polymer materials. In order to improve the yield of the front-end process of the display panel DP (for example, the process of the pixel driving circuit and the non-pixel driving circuit), the second surface 110*b* of the substrate 110 may be provided with a rigid temporary substrate TS, and the material thereof may include glass, quartz, or other materials with appropriate hardness. For example, the removing step of the temporary substrate TS may be performed by a laser lift-off (LLO) method, but is not limited thereto.

Figure 2C:
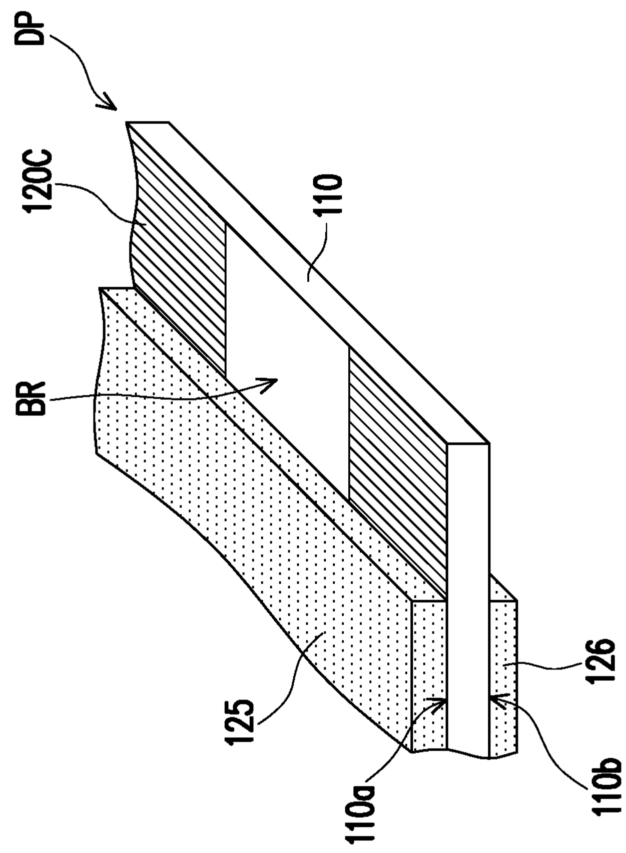

Referring to FIG. 2C and FIG. 3B, after the cutting step of the display panel DP, a protective layer 125 and a protective layer 126 are formed on two opposite sides of the display panel DP (or the substrate 110). The protective layer 125 and the protective layer 126 respectively cover the first surface 110*a* and the second surface 110*b* opposite to the substrate 110 and expose a bonding region BR of the substrate 110. Next, a conductive treatment is performed on the substrate 110 to form a conductive film layer 130. It may be seen from FIG. 2D and FIG. 3B that, during the conductive treatment, the conductive film layer 130 is formed on the surface of the substrate 110 not covered by the two protective layers and the connection pads 120C. That is, the conductive film layer 130 is located at the bonding region BR of the substrate 110 and is not overlapped with the connection pads 120C in the normal direction of the first surface 110*a*.

Figure 2F:
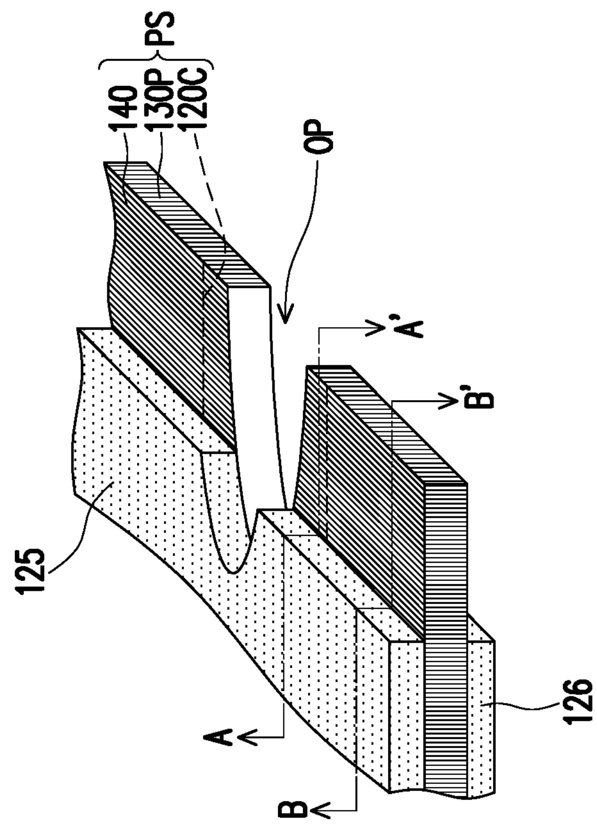
Figure 2E:
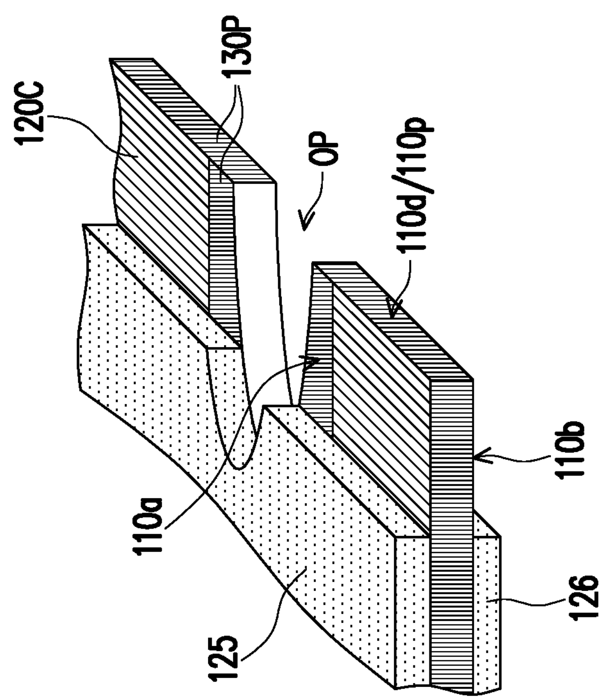
Figure 3D:
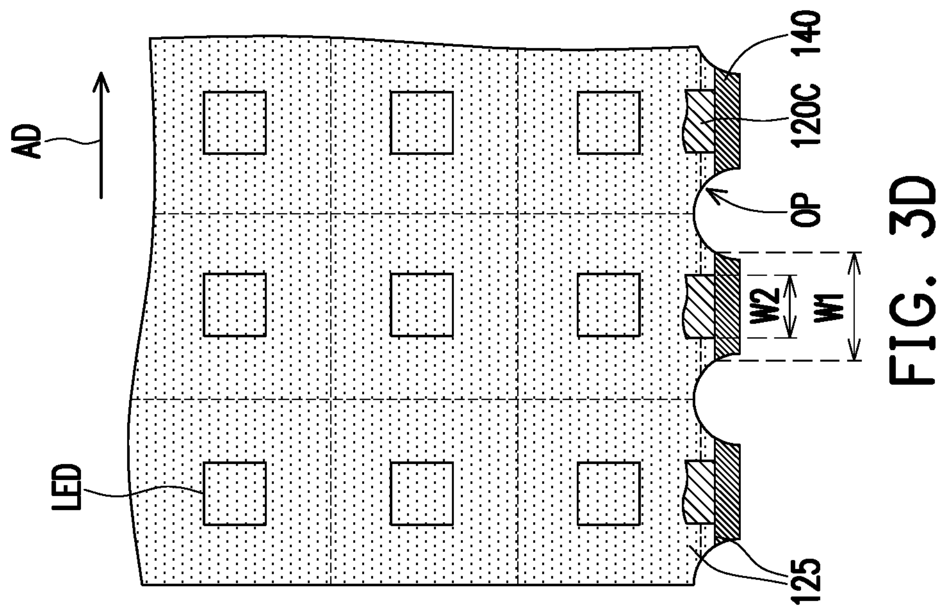
Figure 3C:
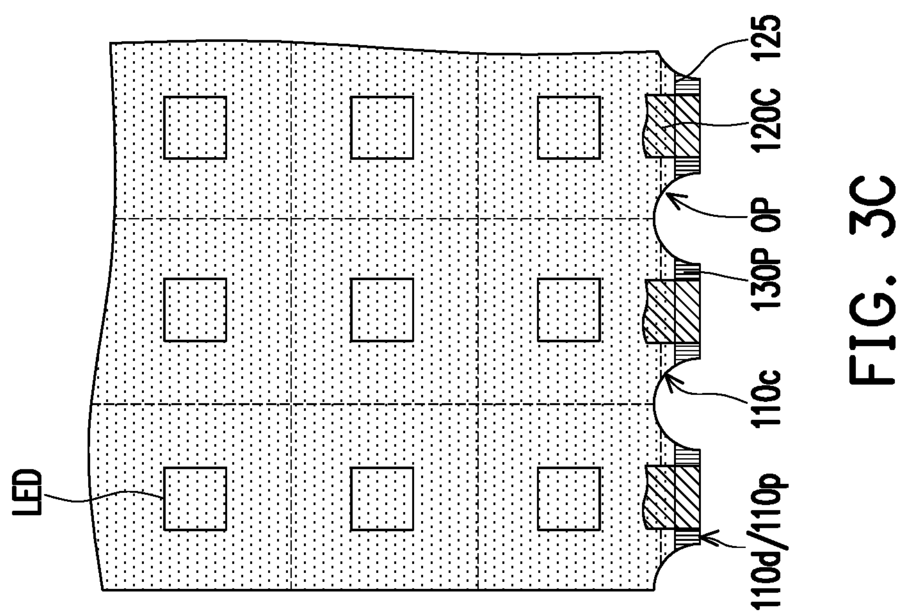

After the conductive treatment of the substrate 110, a drilling step is performed to form a plurality of openings OP, as shown in FIG. 2E and FIG. 3C. The openings OP are respectively located between the plurality of connection pads 120C and are adjacent to the substrate edge 110*e* of the substrate 110. It should be noted that, the conductive film layer 130 is disconnected by the openings OP and forms a plurality of conductive pattern layers 130P structurally separated from each other. Specifically, the openings OP penetrate the first surface 110*a* and the second surface 110*b* of the substrate 110, and the substrate edge 110*e* is disconnected into a plurality of portions 110*p* corresponding to the connection pads 120C. The substrate 110 further has a third surface 110*c* defining the openings OP and connected to the first surface 110*a* and the second surface 110*b*, and the third surface 110*c* is not conductive. Accordingly, the electrical independence of the conductive pattern layers 130P may be ensured.

Moreover, the substrate 110 further has a fourth surface 110*d* defining the portions 110*p* of the substrate edge 110*e* and connected to the first surface 110*a* and the second surface 110*b*, and the conductive pattern layers 130P are extended from the first surface 110*a* to the fourth surface 110*d*. In the present embodiment, the conductive pattern layers 130P are further extended onto the second surface 110*b* of the substrate 110, but are not limited thereto. In other embodiments, the protective layer 126 formed before the conductive treatment of the substrate 110 may also completely cover the second surface 110*b* of the substrate 110. Therefore, after the conductive treatment of the substrate 110, the resulting conductive pattern layers only cover the first surface 110*a* and the fourth surface 110*d* of the substrate 110. For example, the openings OP here may be formed on the substrate 110 by etching, mechanical drilling, laser ablation, or other precise processing methods, but are not limited thereto.

After the drilling step of the substrate 110 is completed, a plurality of auxiliary conductive layers 140 are formed on the plurality of connection pads 120C and the plurality of conductive pattern layers 130P, as shown in FIG. 2F and FIG. 3D. Specifically, the auxiliary conductive layers 140 are in direct contact with the connection pads 120C and the plurality of conductive pattern layers 130P to form an electrical connection relationship. In particular, a connection pad 120C, a conductive pattern layer 130P, and an auxiliary conductive layer 140 located between any two adjacent openings OP form a pad structure PS of the display panel DP. In the present embodiment, the auxiliary conductive layer 140 and the connection pad 120C respectively have a first width W1 and a second width W2 in the arrangement direction (for example, a direction AD) of the plurality of openings OP, and the first width W1 is greater than the second width W2.

More specifically, by disposing the conductive pattern layers 130P, the effective area of the pad structures PS for current transmission may be increased, and the overlapping relationship between the auxiliary conductive layers 140, the conductive pattern layers 130P, and the connection pads 120 may stabilize the electrical connection relationship of the conductive pattern layers 130P and the connection pads 120. Accordingly, the current transmission capability of the pad structures PS may be improved.

Referring to FIG. 2F, FIG. 4A, and FIG. 4B, since the conductive pattern layer 130P is not overlapped with the connection pad 120C in the normal direction of the first surface 110*a* of the substrate 110, the pad structure PS shows different laminated structures at section line A-A' and section line B-B'. For example, a portion of the pad structure PS located at section line A-A' is only a laminated structure of the conductive pattern layer 130P and the auxiliary conductive layer 140 (as shown in FIG. 4A), and the conductive pattern layer 130P sandwiched between the substrate 110 and the auxiliary conductive layer 140 is extended to the fourth surface 110*d* and the second surface 110*b* of the substrate 110. Another portion of the pad structure PS located at section line B-B' is substantially a laminated structure of the connection pad 120C and the auxiliary conductive layer 140 (as shown in FIG. 4B), and the conductive pattern layer 130P located at the fourth surface

110*d* and the second surface 110*b* of the substrate 110 is electrically connected to the connection pad 120C via the laminated structure of the conductive pattern layer 130P and the auxiliary conductive layer 140 at section line A-A'. Via the above configuration relationship, the bonding area of the pad structure PS may be increased to improve the bonding (or tiling) yield of the display panel DP.

Figure 2G:
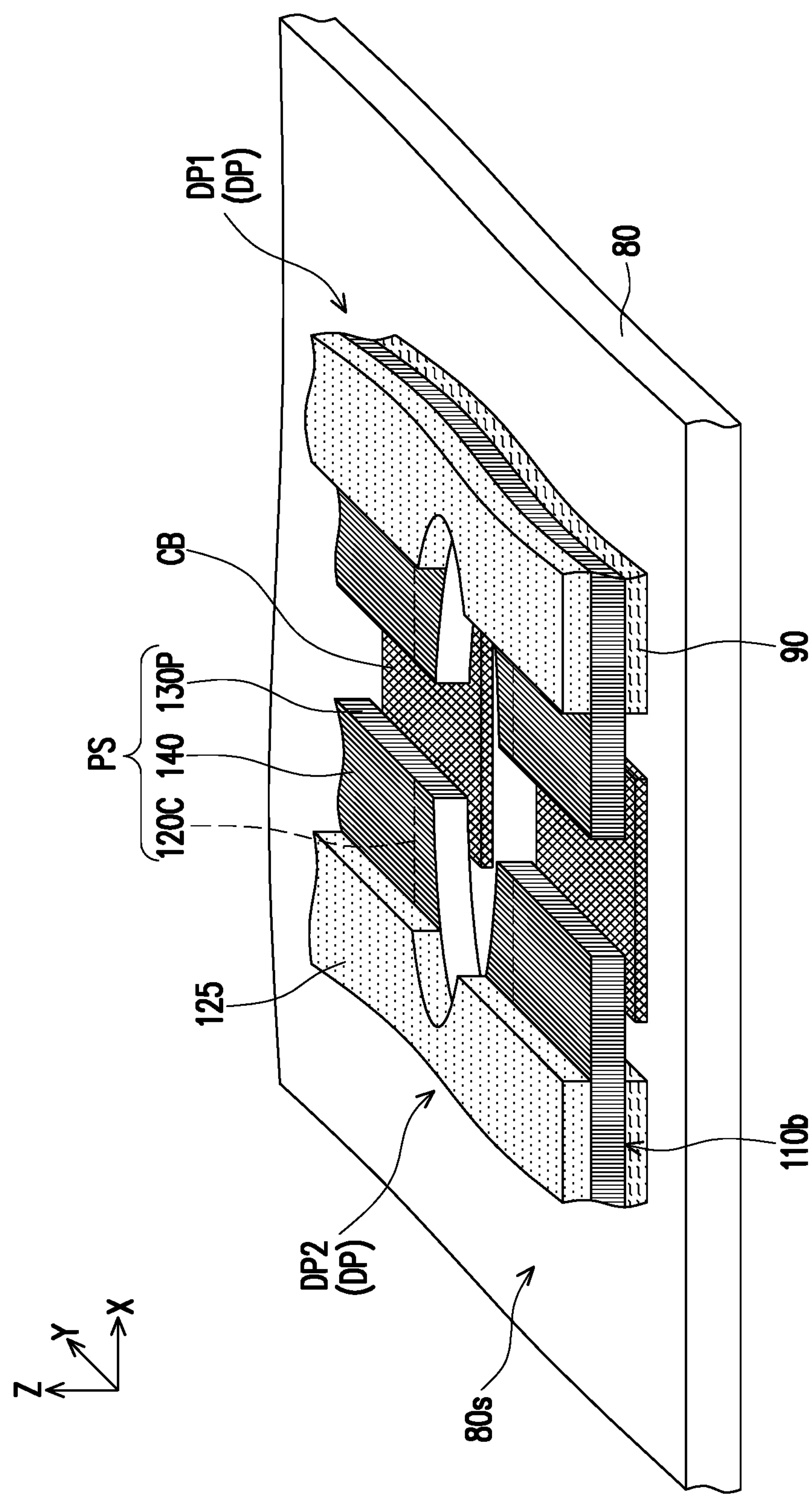
Figure 3E:
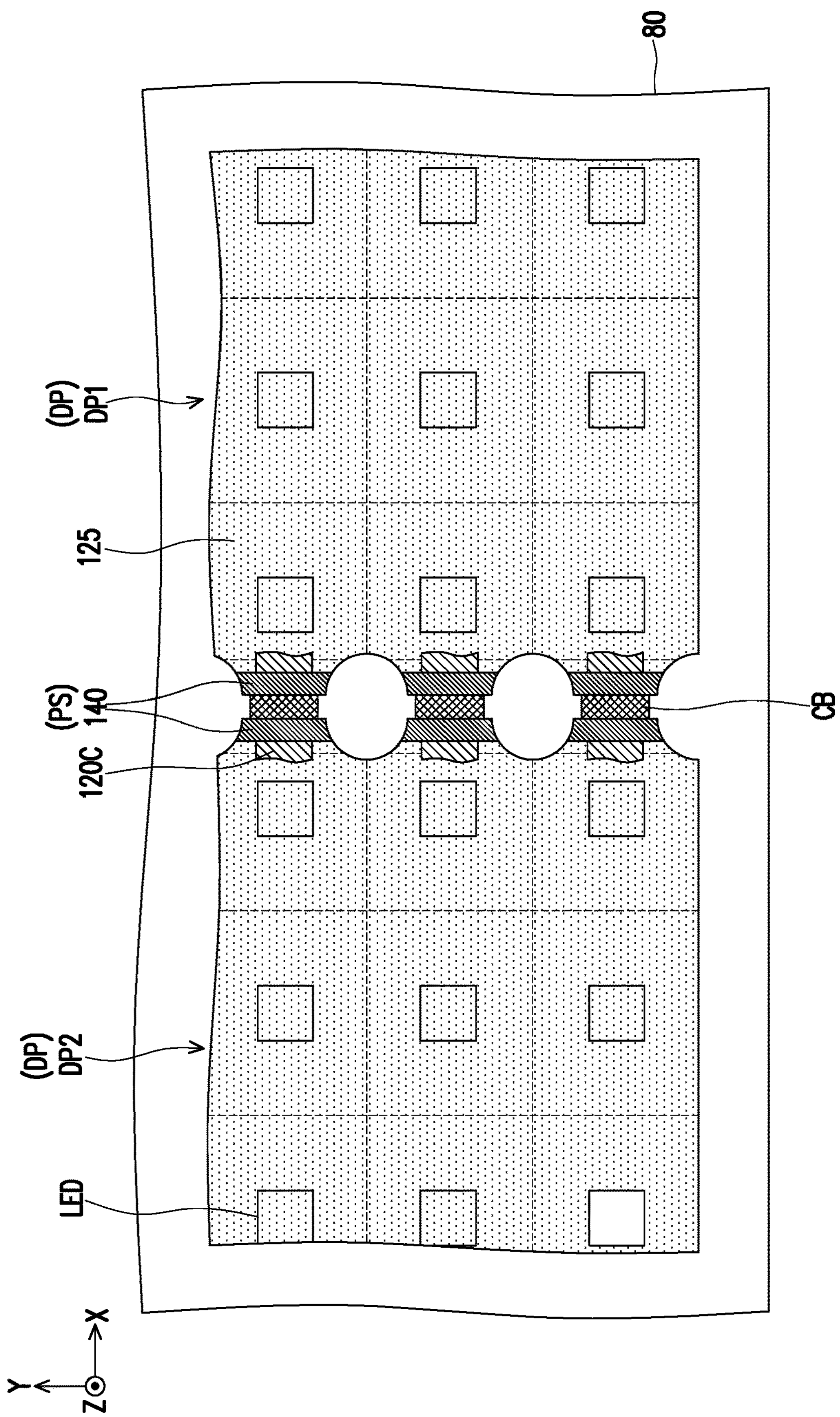

Referring to FIG. 2G, FIG. 3E, and FIG. 5A, after the pad structure PS of the display panel DP is completed, at least one display panel DP (such as the display panel DP1 and the display panel DP2) is bonded onto the carrier surface 80*s* of the carrier 80. In the present embodiment, the carrier 80 may have a plurality of conductive bumps CB disposed on the carrier surface 80*s*. When the display panel DP is bonded to the carrier 80, the conductive bumps CB are respectively overlapped with a plurality of pad structures PS (for example, the conductive pattern layer 130P) of the display panel DP in the normal direction (for example, a direction Z) of the carrier surface 80*s*. However, the invention is not limited thereto. In other embodiments, the carrier may also be a temporary substrate for tiling a plurality of display panels DP. That is, the carrier may also be only a temporary substrate used in the tiling process without the conductive bumps CB.

In particular, in the present embodiment, since the display panel DP is bonded in such a manner that the second surface 110*b* of the substrate 110 faces the carrier 80, before the bonding step of the display panel DP and the carrier 80, the protective layer 126 located on the second surface 110*b* of the substrate 110 may be removed first, but is not limited thereto. According to other embodiments, in order to simplify the manufacturing process, the protective layer 126 here may also be retained before the bonding step of the display panel DP and the carrier 80.

Moreover, in order to fix the display panel DP on the carrier surface 80*s*, the carrier 80 is further provided with an adhesive layer 90, and the adhesive layer 90 is connected between the second surface 110*b* of the display panel DP and the carrier surface 80*s*. It is worth noting that the adhesive layer 90 and the conductive bumps CB respectively have a first height H1 and a second height H2 in the normal direction (for example, the direction Z) of the carrier surface 80*s*, and the first height H1 of the adhesive layer 90 is greater than the second height H2 of the conductive bumps CB. In other words, there is a gap G between the pad structures PS of the display panel DP and the conductive bumps CB of the carrier 80. Accordingly, the phenomenon that the pad structures PS are directly in contact with the conductive bumps CB causing edge warping may be avoided, thus helping to ensure the flatness of the display panel DP when bonded to the carrier 80, especially the overall flatness when a plurality of display panels DP are tiled.

It is worth mentioning that, in order to improve the transfer process yield of the light-emitting elements LED of the display apparatus 10, in the present embodiment, the light-emitting diodes LED are already bonded to a plurality of pads (the pad P1 and the pad P2 shown in FIG. 6A) of the substrate 110 (or the display panel DP) before the tiling process of the display panel DP (more specifically, before the cutting step of the display panel DP) in order to avoid the die transfer process of a large-size (for example, the sum of the crystal grain transfer area of a plurality of display panels DP) substrate. In other words, for a display panel DP with a smaller size, after the light-emitting elements LED are transposed, the bonding process of the display panel DP and the carrier 80 may be performed, thus helping to improve the transfer process yield of the light-emitting elements LED. However, the invention is not limited thereto. According to other embodiments, the transfer process of the light-emitting elements LED may also be performed after the tiling process of the display panel DP is completed, so as to prevent the light-emitting elements LED from being damaged during the tiling process of the display panel DP.

Figure 2H:
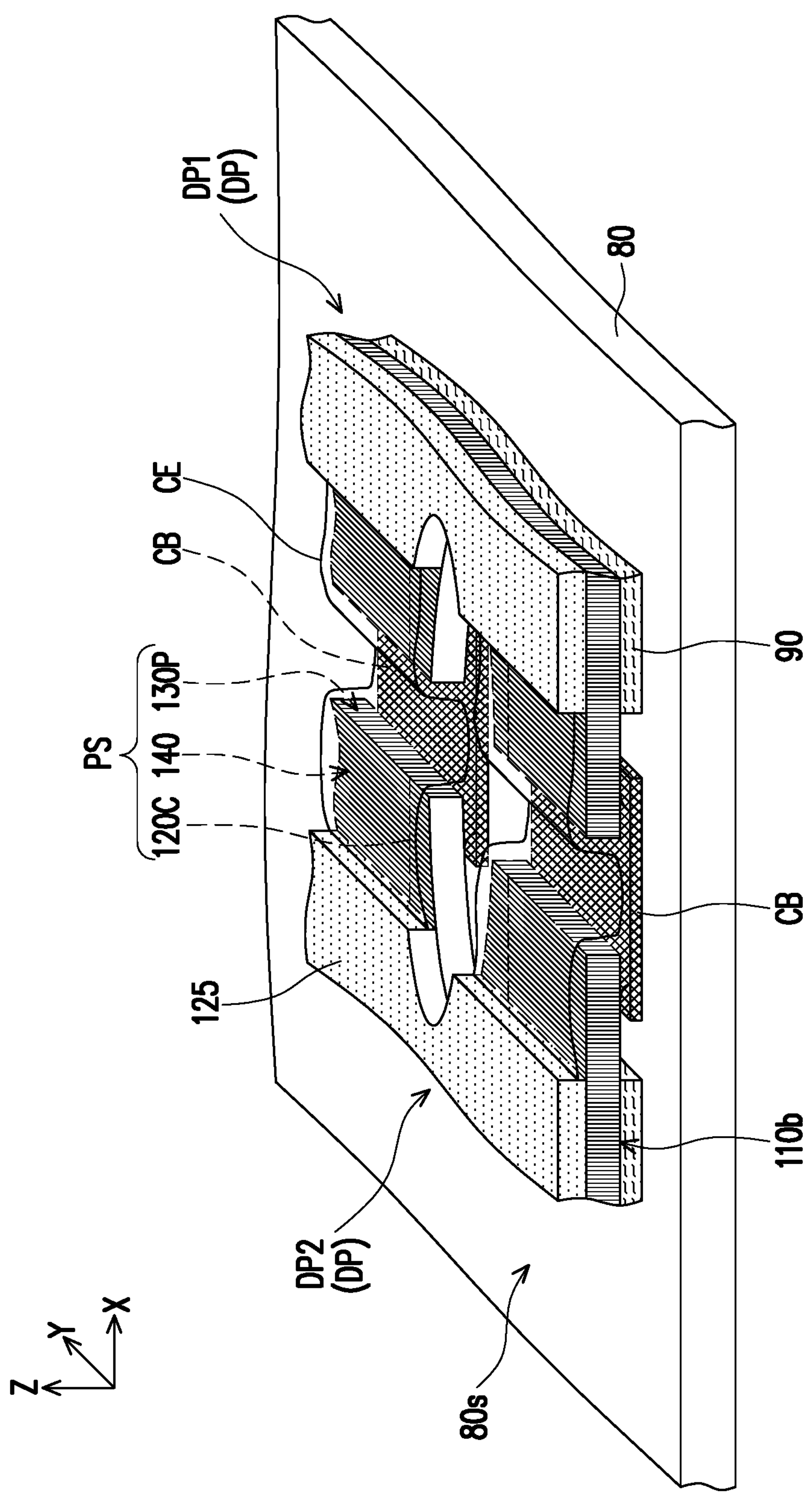
Figure 3F:
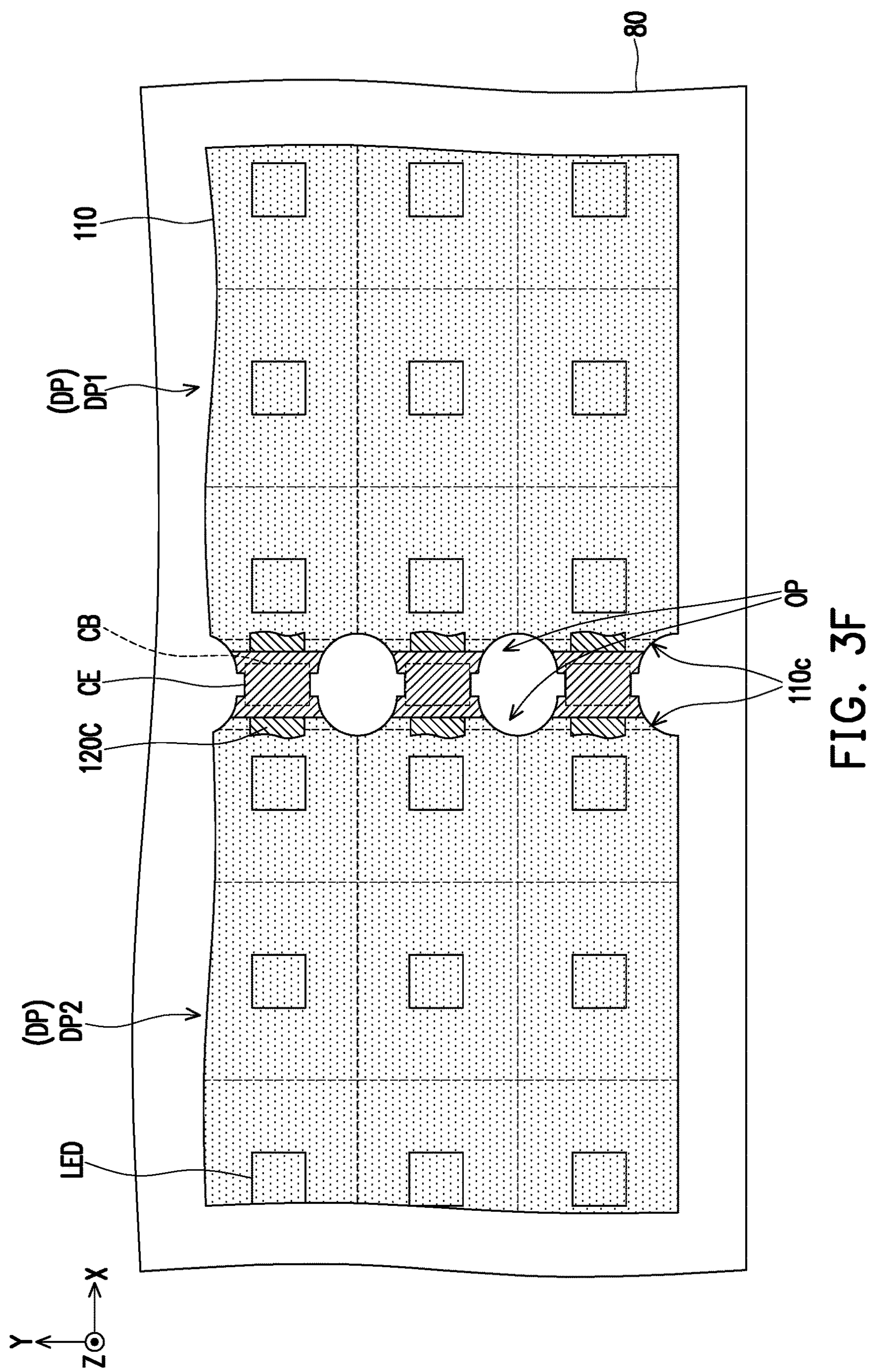

Referring to FIG. 2H, FIG. 3F, and FIG. 5B, after the bonding step of the display panel DP and the carrier 80 is completed, a plurality of connecting electrode layers CE are formed on the plurality of pad structures PS of the display panel DP and the conductive bumps CB of the carrier 80 to electrically connect the pad structures PS and the conductive bumps CB. For example, the method of forming the connecting electrode layers CE may be implemented by electroplating. For example, the carrier 80 with a plurality of display panels DP bonded thereto is disposed in an electroplating tank, a plurality of connection pads 120C (or the pad structures PS) of the display panels DP are electrically connected to the cathode of an external voltage source, and the anode of the external voltage source is electrically connected to a metal material electrode plate in the electroplating tank. During the electroplating process, a DC bias voltage is applied between the connection pads 120C and the metal electrode plate (that is, the connection pads 120C have a DC potential) so as to plate the connecting electrode layers CE on the pad structures PS of the display panels DP.

Figure 2I:
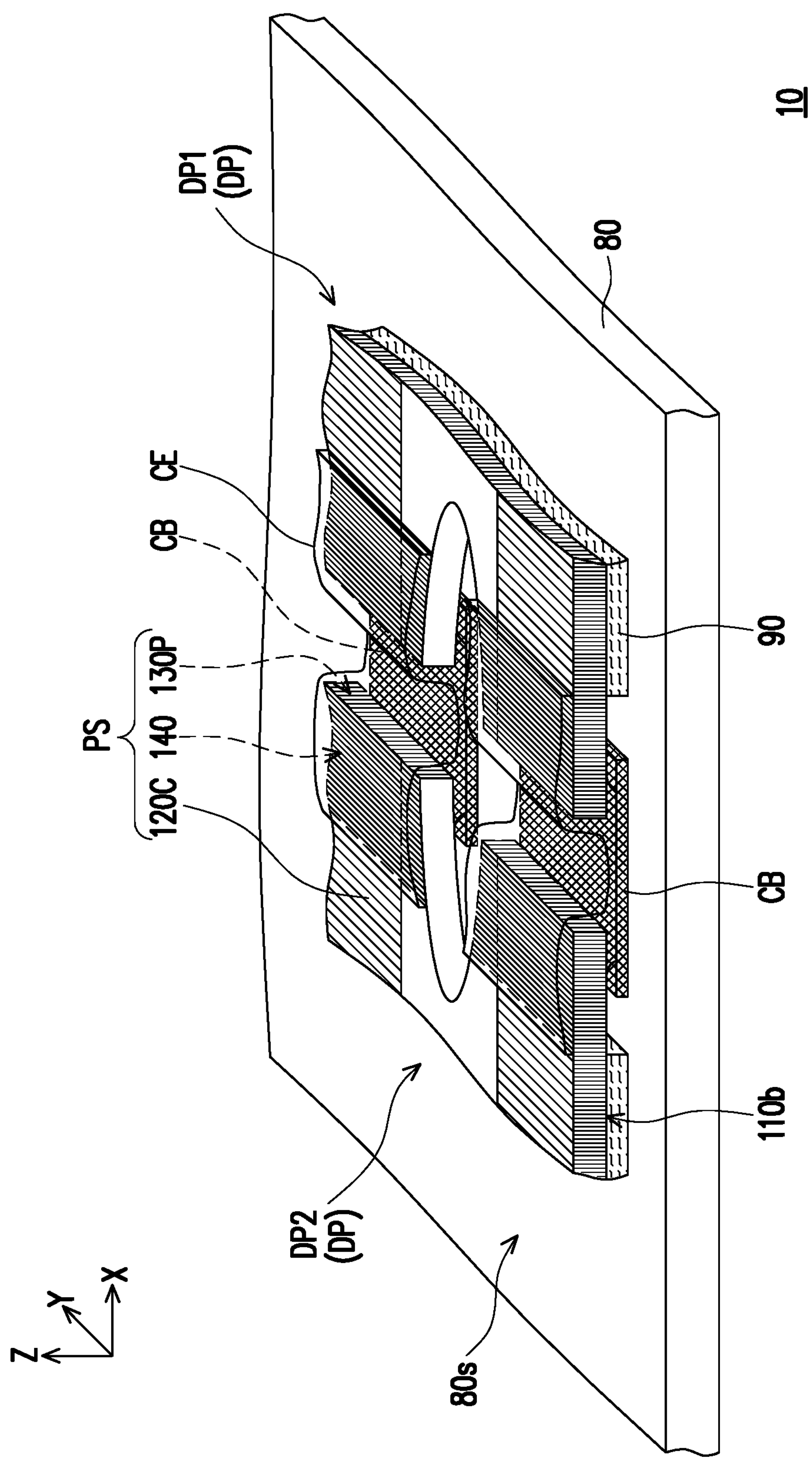

In particular, since there is the gap G between the pad structures PS of the display panels DP and the conductive bumps CB of the carrier 80, during the process of forming the connecting electrode layers CE, the conductive pattern layer 130P on the second surface 110*b* of the substrate 110 also forms an electroplated layer, and the electroplated layer is gradually thickened and in contact with the conductive bumps CB of the carrier 80 to complete the forming step of the connecting electrode layers CE. However, the invention is not limited thereto. According to other embodiments, the carrier may be a temporary substrate (that is, the carrier may not have the conductive bumps CB), and the forming step of the connecting electrode is completed after an electroplated layer formed on the fourth surface 110*d* of the substrate 110 of a display panel DP is gradually thickened and in contact with another electroplated layer on the fourth surface 110*d* of the substrate 110 of another display panel DP. Next, the protective layer 125 located on the first surface 110*a* of the substrate 110 is removed, as shown in FIG. 2I, FIG. 3F, and FIG. 5B. At this point, the tiling process of the display apparatus 10 of the present embodiment is completed.

It may be seen from FIG. 2I, FIG. 3F, and FIG. 5B that the display apparatus 10 may be formed by tiling a plurality of display panels DP. The display panels DP include a substrate 110, a plurality of pad structures PS, and a plurality of openings OP. The substrate 110 has a first surface 110*a* and a second surface 110*b* opposite to each other. The pad structures PS are disposed on the first surface 110*a* of the substrate 110 and respectively have a connection pad 120C, a conductive pattern layer 130P, and an auxiliary conductive layer 140 electrically connected to each other. The auxiliary conductive layer 140 is overlapped with the conductive pattern layer 130P and the connection pad 120C along a normal direction of the first surface 110*a*. The openings OP penetrate the first surface 110*a* and the second surface 110*b* of the substrate 110 and are alternately arranged with the pad structures PS. It should be mentioned that, the substrate 110 further has a third surface 110*c* defining the openings OP and connected to the first surface 110*a* and the second surface 110*b*, and the third surface 110*c* is not conductive. Accordingly, the pad structures PS may be ensured to be electrically independent of each other.

Moreover, since the pad structures PS of the display panels DP of the present embodiment have a greater bonding area, the connecting electrode layers CE formed between the bonding surface (for example, the surface of the auxiliary conductive layer 140 and the surface of the conductive pattern layer 130P not covered by the auxiliary conductive layer 140) of the pad structures PS and the conductive bumps CB may provide a more stable electrical connection relationship between the display panels DP and the carrier 80 so as to improve the bonding yield of the display panels DP and the driving performance of the display apparatus 10 (for example, the transmission capability of large current).

In the following, another embodiment is provided to explain the invention in detail. The same components are labeled with the same reference numerals, and the description of the same technical content is omitted. For the omitted parts, please refer to the foregoing embodiments, which are not described again below.

Figure 6A:
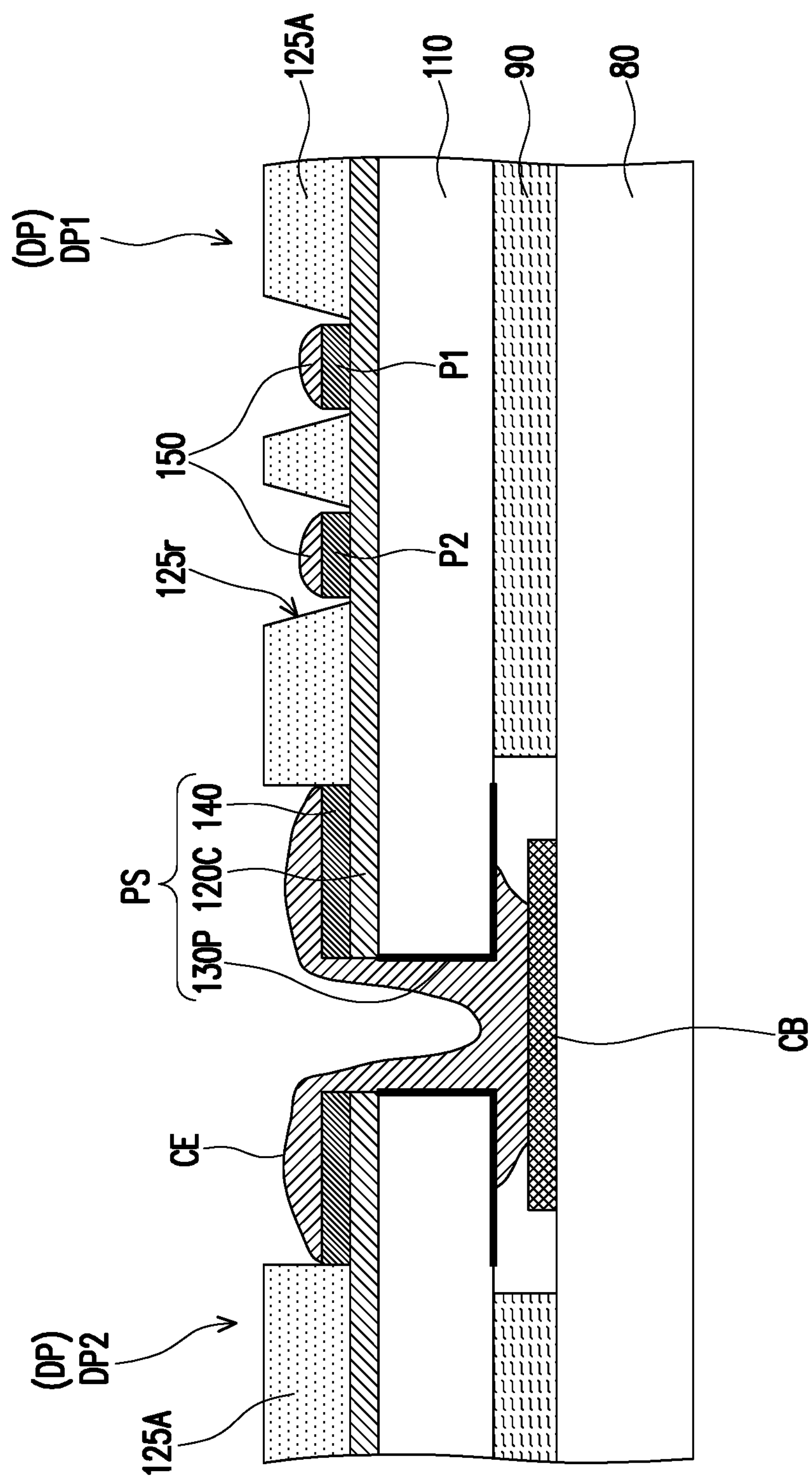
FIG. 6A and FIG. 6B are cross-sectional views of a manufacturing process of a display apparatus of another embodiment of the invention.
Figure 6B:
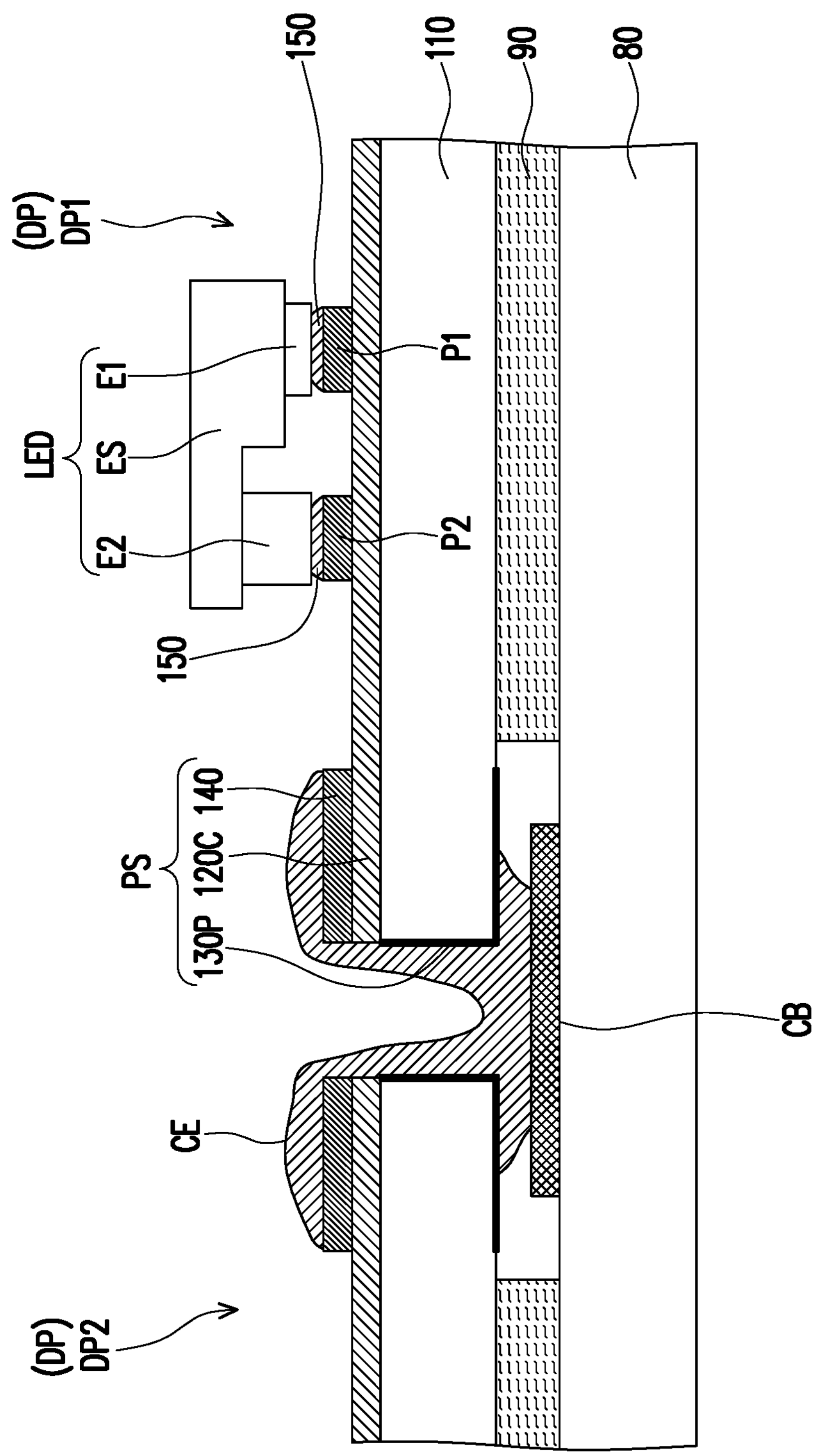

FIG. 6A and FIG. 6B are cross-sectional views of a manufacturing process of a display apparatus of another embodiment of the invention. Referring to FIG. 6A and FIG. 6B, the main difference between a display apparatus 11 of the present embodiment and the display apparatus 10 of FIG. 5B is that: in the tiling process of the display apparatus 11, in the forming step of the connecting electrode layer 140, a solder pattern 150 (or a solder bump) located in a groove 125*r* of a protective layer 125A may also be formed at the same time. Therefore, the forming step of the protective layer 125A may further include etching a protective material layer (not shown) to form the groove 125*r*, but the invention is not limited thereto.

Moreover, in the forming step of the auxiliary conductive layer 140, a plurality of pads (for example, the pad P1 and the pad P2) for bonding the light-emitting elements LED may be formed at the same time. In other words, the light-emitting elements LED of the display apparatus 11 of the present embodiment are bonded onto the display panels DP after the tiling process of a plurality of display panels DP (for example, the first display panel DP1 and the second display panel DP2) is completed. In the present embodiment, the light-emitting elements LED are, for example, flip-chip type light-emitting diodes. The light-emitting elements LED include a first electrode E1, a second electrode E2, and an epitaxial structure ES. The two electrodes are located at the same side of the epitaxial structure ES and are electrically connected to two pads via a solder pattern 150, but are not limited thereto. In other embodiments, two electrodes of the light-emitting elements LED may also be respectively located at two opposite sides of the epitaxial structure ES, such as vertical type light-emitting diodes.

Figure 7:
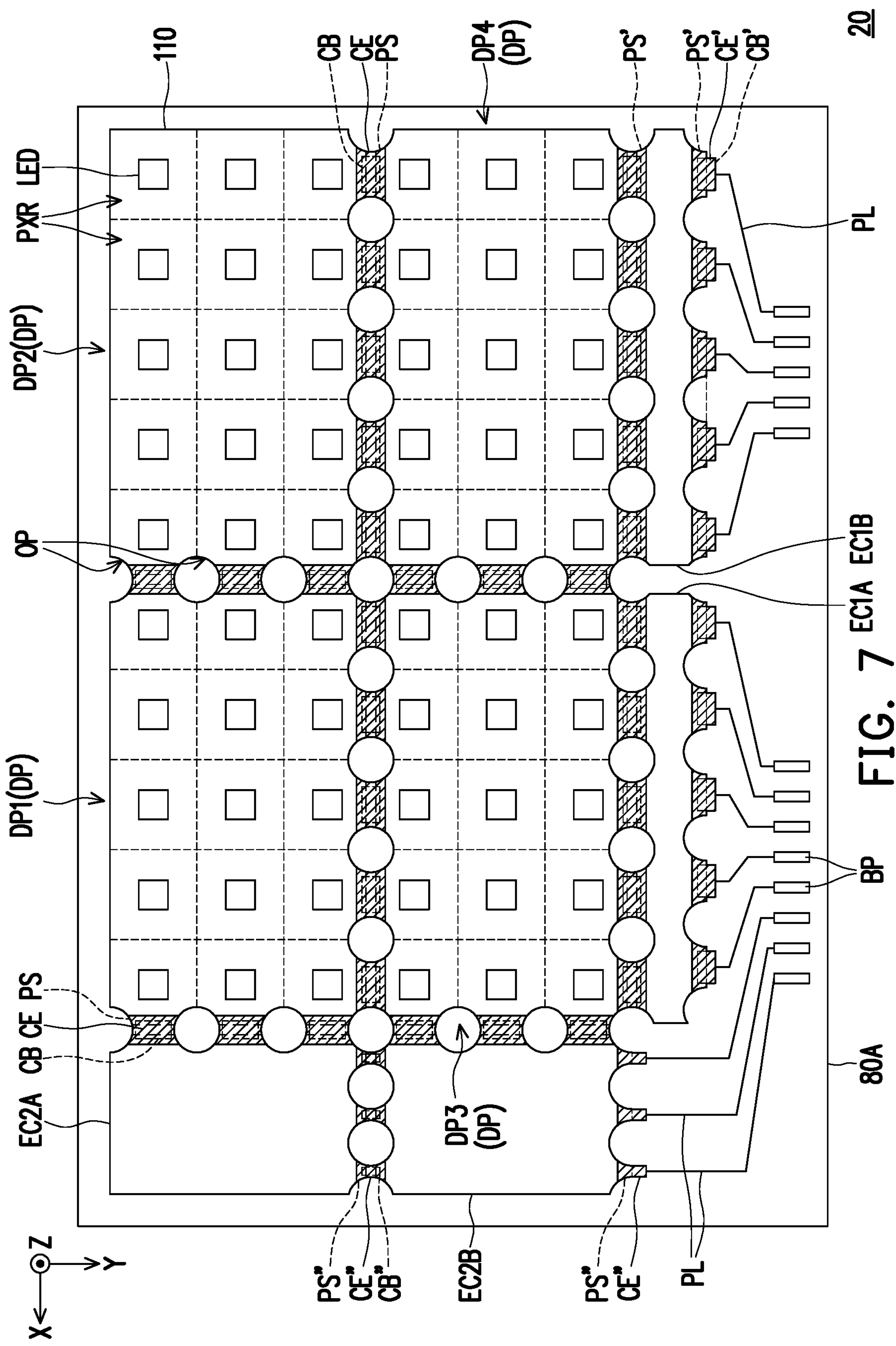
FIG. 7 is a top view of a display apparatus of another embodiment of the invention.

FIG. 7 is a top view of a display apparatus of another embodiment of the invention. Please refer to FIG. 7, the difference between a display apparatus 20 of the present embodiment and the display apparatus 10 of FIG. 1 is that the non-pixel driving circuit of the display apparatus 20 is also disposed in a tiling manner. For example, a non-pixel driving circuit EC1A and a non-pixel driving circuit EC1B of the present embodiment are fabricated on a printed circuit board (or a flexible circuit board) and are used to replace the non-pixel driving circuit EC1 of the carrier 80 of FIG. 1. Via the arrangement of pad structures PS' and a connecting electrode layer CE', the non-pixel driving circuit EC1A and the non-pixel driving circuit EC1B are respectively electrically connected to a plurality of conductive bumps CB' of a carrier 80A.

Similarly, a non-pixel driving circuit EC2A and a non-pixel driving circuit EC2B are fabricated on a printed circuit board (or a flexible circuit board) and are used to replace the non-pixel driving circuit EC2 of the carrier 80 of FIG. 1. Via the arrangement of pad structures PS" and connecting electrode layers CE", the non-pixel driving circuit EC2A and the non-pixel driving circuit EC2B are respectively electrically connected to a plurality of conductive bumps CB" of the carrier 80A. Accordingly, the design flexibility of the display apparatus 20 may be improved.

Based on the above, in the display apparatus and the method of fabricating the same of an embodiment of the invention, the plurality of openings disposed between the plurality of pad structures of the display panel may make the plurality of conductive pattern layers of the pad structures be structurally separated from each other to ensure the electrical independence of the pad structures. Via the overlapping relationship between the auxiliary conductive layers, the conductive pattern layers, and the connection pads, the electrical connection relationship between the conductive pattern layers and the connection pads may be stabilized, thereby increasing the bonding area of the pad structures to increase the bonding (or tiling) yield of the display panel and the driving electrical properties of the display apparatus.

What is claimed is:

1. A display apparatus, comprising:

at least one display panel, the display panel comprising:

a substrate having a first surface and a second surface opposite to each other;

a plurality of pad structures disposed on the first surface of the substrate, wherein each of the pad structures has a connection pad, a conductive pattern layer, and an auxiliary conductive layer electrically connected to each other, and the auxiliary conductive layer is overlapped with the conductive pattern layer and the connection pad in a normal direction of the first surface; and a plurality of openings disposed on the substrate and penetrating the first surface and the second surface of the substrate, wherein the openings and the pad structures are alternately arranged, the substrate also has a third surface defining each of the openings and connected to the first surface and the second surface, and the third surface is not conductive.

2. The display apparatus of claim 1, wherein the auxiliary conductive layer and the connection pad respectively have a first width and a second width in an arrangement direction of the pad structures, and the first width is greater than the second width.

3. The display apparatus of claim 1, wherein the conductive pattern layer is not overlapped with the connection pad in the normal direction of the first surface.

4. The display apparatus of claim 1, wherein the substrate further has a fourth surface connected to the first surface, the second surface, and the third surface, and the conductive pattern layer of each of the pad structures is extended from the first surface to the fourth surface.

5. The display apparatus of claim 4, wherein the conductive pattern layer of each of the pad structures is further extended to the second surface.

6. The display apparatus of claim 1, further comprising:

a plurality of connecting electrode layers covering the conductive pattern layers and the auxiliary conductive layers of the pad structures, wherein the at least one display panel comprises a first display panel and a second display panel, and each of the connecting electrode layers is electrically connected to one of the pad structures of the first display panel and one of the pad structures of the second display panel.

7. The display apparatus of claim 1, further comprising:

a carrier having a carrier surface and a plurality of conductive bumps disposed on the carrier surface, wherein the at least one display panel is disposed on the carrier surface, and the conductive pattern layers of the pad structures are overlapped with the conductive bumps respectively.

8. The display apparatus of claim 7, further comprising:

a plurality of connecting electrode layers covering the pad structures and the conductive bumps, wherein the at least one display panel comprises a first display panel and a second display panel, and each of the connecting electrode layers is electrically connected to one of the pad structures of the first display panel, one of the pad structures of the second display panel, and one of the conductive bumps.

9. The display apparatus of claim 8, wherein the connecting electrode layers further directly cover a portion of a surface at which the conductive bumps and the pad structures are overlapped.

10. The display apparatus of claim 1, wherein a material of the substrate comprises an organic polymer material.

11. The display apparatus of claim 1, wherein the pad structures and the openings are located at at least one substrate edge of the substrate.

* * * * *